(12) United States Patent
Wunderlich

(10) Patent No.: US 6,727,537 B2
(45) Date of Patent: Apr. 27, 2004

(54) MAGNETIC MEMORY CELL

(75) Inventor: Joerg Wunderlich, Cambridge (GB)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/189,430

(22) Filed: Jul. 8, 2002

(65) Prior Publication Data

US 2003/0085413 A1 May 8, 2003

(30) Foreign Application Priority Data

Aug. 11, 2001 (EP) .............................................. 01309470

(51) Int. Cl.[7] .............................................. H01L 29/76
(52) U.S. Cl. ...................... 257/295; 257/421; 257/422; 257/424; 257/427
(58) Field of Search ................................ 257/295, 421, 257/422, 424, 427; 360/112, 113; 324/249, 251, 252; 365/97, 145, 170, 171, 182

(56) References Cited

U.S. PATENT DOCUMENTS

| | | | |
|---|---|---|---|
| 3,938,110 A | | 2/1976 | Kataoka et al. |
| 5,025,416 A | * | 6/1991 | Prinz ........................... 365/170 |
| 5,068,826 A | * | 11/1991 | Matthews ................... 365/170 |
| 5,075,247 A | * | 12/1991 | Matthews ...................... 438/3 |
| 5,089,991 A | * | 2/1992 | Matthews ....................... 365/9 |
| 5,295,097 A | | 3/1994 | Lienau |
| 5,504,643 A | * | 4/1996 | Lazzari ....................... 360/113 |
| 5,549,978 A | * | 8/1996 | Iwasaki ....................... 428/692 |
| 5,652,445 A | * | 7/1997 | Johnson ...................... 257/295 |
| 6,191,581 B1 | * | 2/2001 | Van Dau et al. ............. 324/249 |
| 6,387,476 B1 | * | 5/2002 | Iwasaki et al. ............. 428/212 |
| 6,483,741 B1 | * | 11/2002 | Iwasaki et al. ............. 365/170 |
| 2002/0094457 A1 | * | 7/2002 | Krusin-Elbaum et al. ... 428/694 |

FOREIGN PATENT DOCUMENTS

EP      1028474 A2    8/2000

OTHER PUBLICATIONS

European Search Report, Application No. EP 01 30 9470 (2002).

* cited by examiner

Primary Examiner—David Nelms
Assistant Examiner—Andy Huynh
(74) Attorney, Agent, or Firm—Antonelli, Terry, Stout & Kraus, LLP

(57) ABSTRACT

A magnetic memory device based on easy domain wall propagation and the extraordinary Hall effect includes a perpendicular-to-plane a magnetic electrically conductive element (2) that includes a memory node (3). Electrical conductors (12–15) surround the node (3) so that when energised, a magnetic field is produced to change the magnetization state of the node (3). In memory state "0" a magnetic domain is pinned within tapered portion (5) of the element (2). When a magnetic field is applied to the device, the domain (D) becomes unpinned and extends into the node (3) to produce a "1" state. The state of magnetization is sensed by means of a Hall contact (11). The current pulse ($J_c$) is applied through the element (2) so that the Hall voltage can be detected.

28 Claims, 5 Drawing Sheets

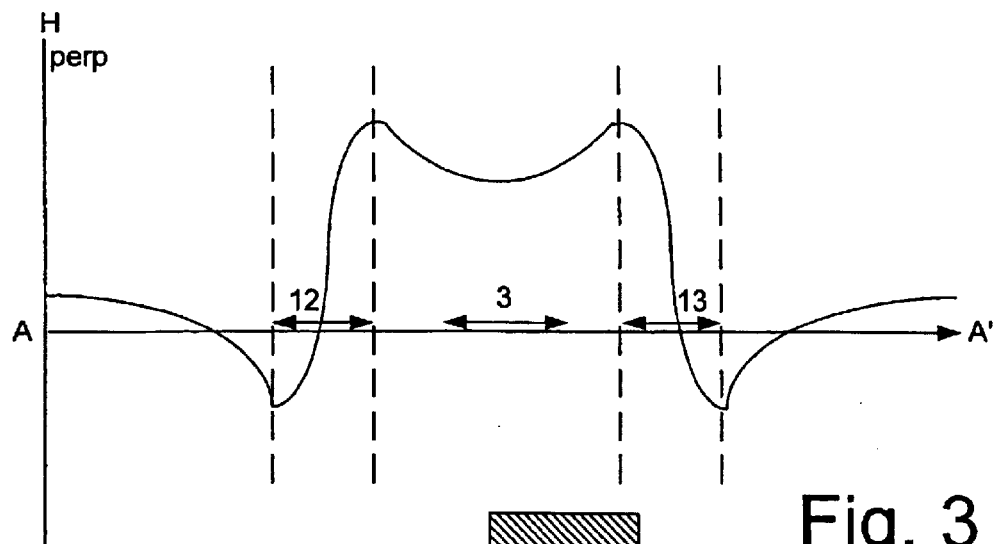
Fig. 3
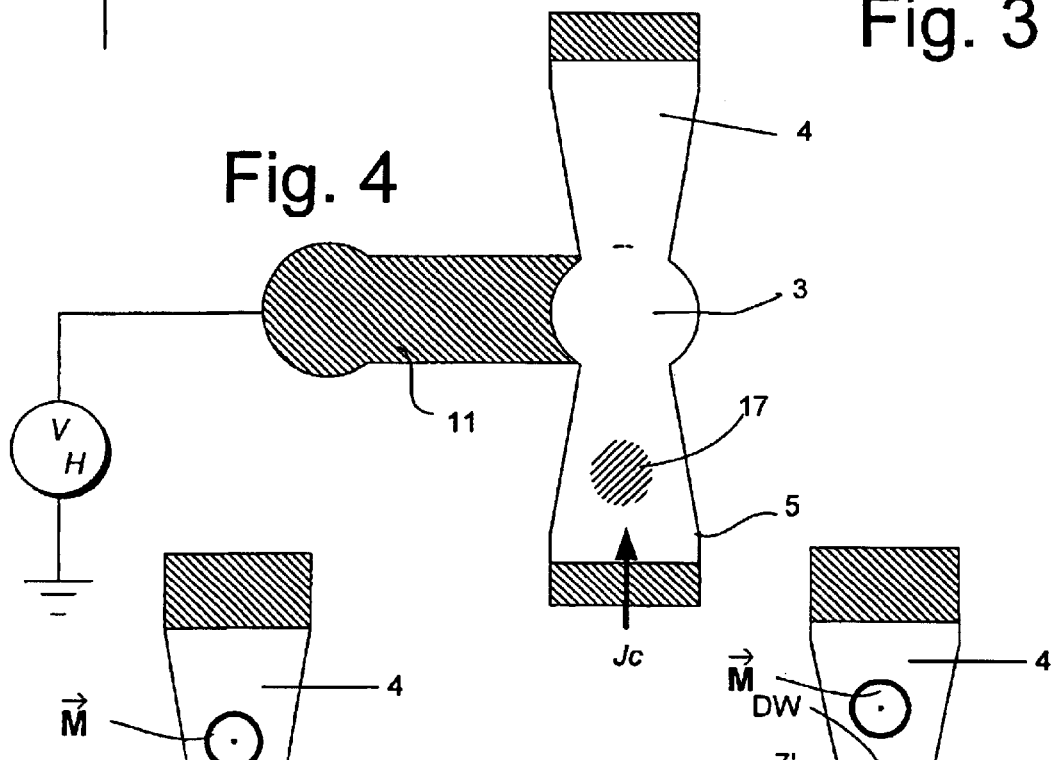
Fig. 4
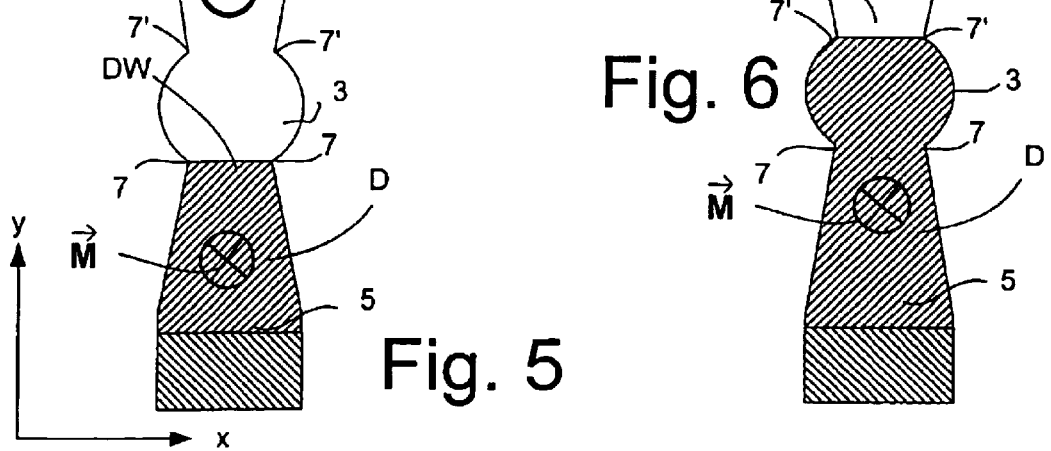
Fig. 5
Fig. 6

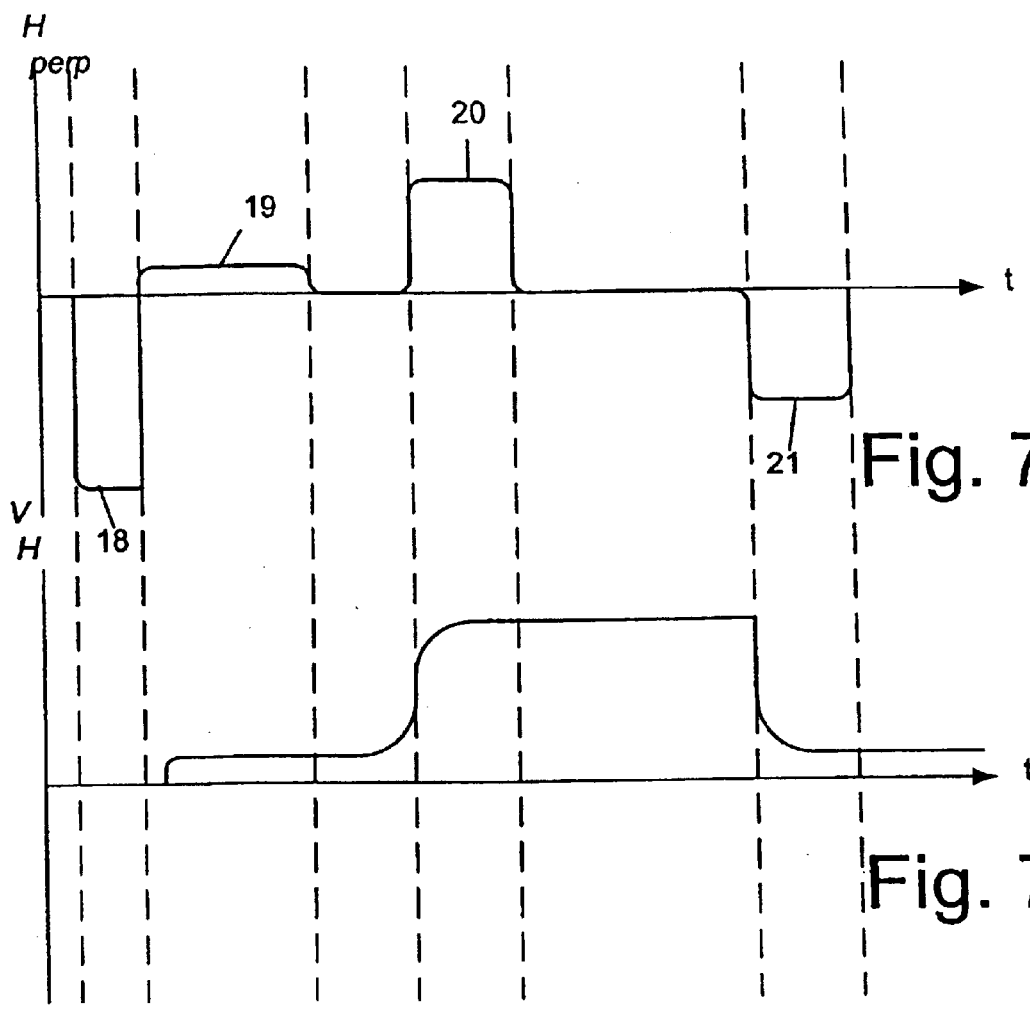
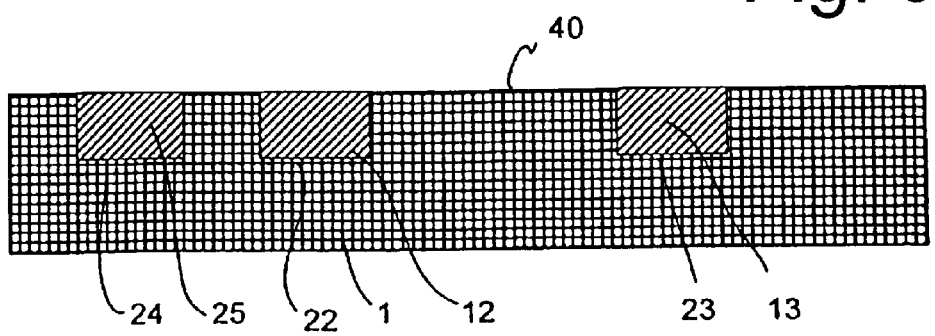

MAGNETIC MEMORY CELL

FIELD OF THE INVENTION

This invention relates to a magnetic memory cell that has particular but not exclusive application to memory devices which include a memory array.

BACKGROUND

Hitherto, non-volatile random access memories (MVRAMs) have been proposed including magnetic random access memories (MRAMs) and ferroelectric RAMs (FRAMs), as candidates to replace conventional dynamic random access memories (DRAMs) and hard disc drives. A number of devices have been proposed which make use of giant magneto resistance (GMR) in multi-layers, as described in M. N. Baibich, J. M. Broto, A. Fert, F. Nguyen van Dau, F. Petroff, P. Erienne, G. Gruzet, A. Friedrich, and J. Chazelas, Phys. Rev. Lett 61, 2472 (1988). Also, devices based on tunnelling magneto resistance (TMR) in magnetic tunnel junctions have been proposed as described in J. F. Bobo, F. B. Mancoff, K. Bessho, M. Sharma, K. Sin, D. Guarisco, S. X. Wang and B. M. Clemens, J. Appl. Phys. 83 6685 (1998). In these devices, information is stored in terms of the orientation of the magnetisation of small patterned structures and is read by measuring resistance. Previously proposed MRAM devices utilise in-plane magnetised magnetic layers together with a GMR or TMR measurement.

Another MRAM device has been proposed that utilises Hall effect measurements in a essentially two dimensional electron gas semiconductor multi-layer as described in F. G. Monzon, M. Johnson and M. L. Roukes, Appl. Phys. Lett. 71, 3087 (1997).

The use of in-plane magnetised magnetic layers imposes a restriction on the amount of downscaling that can be achieved in order to miniaturise the devices. Downscaling is limited by the increasing effect of the demagnetising field, generated by the magnetic sinks and sources of the magnetisation at the boundaries of the device. This causes a decrease in the effective magnetic anisotropy as the cell size is decreased, until the super-parametric limit is reached where the cell magnetisation becomes unstable at room temperature.

SUMMARY OF THE INVENTION

With a view to overcoming this problem, the present invention provides a magnetic memory cell comprising: an elongate, magnetic conductive element, a magnetic field producing device to apply a magnetic field to the conductive element, and a contact to allow detection of a Hall voltage developed across the element, the magnetic conductive element being configured to allow a magnetic domain to be induced therein and to provide pinning for its domain wall whereby the domain adopts a first configuration or a second different pinned configuration dependant upon the magnetic field produced by the magnetic field producing device, and such that first and second different values of the Hall voltage are produced for said respective domain wall configurations when an electrical current is passed through the magnetic conductive element.

The magnetic conductive element may comprise at least one planar layer of magnetic material with its easy or preferred axis of magnetisation extending transversely to the plane thereof, more particularly perpendicular to the plane. In this way, the influence of the demagnetising field is significantly less dependent on the lateral cell size than hitherto, which facilitates downscaling of the cell for purposes of miniaturisation. Layers of the magnetic material may be configured between layers of non-magnetic electrically conductive material. One material system may comprise layers of cobalt and platinum, which may be formed as a superlattice. Alternatively, $\tau\text{-}Mn_{0.6-x}Ni_xAl_{0.4}$ where $x<0.08$ may be used.

The magnetic conductive element may include a region of reduced coercivity to promote formation of the induced magnetic domain. The region of reduced coercivity may be produced by focussed ion beam irradiation, for example using $He^+$ ions at high fluency or $Ga^+$ ions.

BRIEF DESCRIPTION OF THE DRAWINGS

In order that the invention may be more fully understood an embodiment thereof will now be described by way of example with reference to the accompanying drawings in which.

FIG. 3 illustrates the perpendicular component of the magnetic field produced along the line A–A' by energisation of field producing conductors shown in FIG. 2;

FIG. 4 illustrates a memory cell before initialisation;

FIG. 5 is a schematic illustration of the memory cell in its "0" state;

FIG. 6 illustrates a memory cell in its "1" state;

FIG. 7a is a graph illustrating magnetic field pulses applied to the device;

FIG. 7b illustrates the extraordinary Hall effect voltage produced in response to the applied magnetic pulses shown in FIG. 7a;

FIGS. 8a–8e illustrate process steps for fabrication of the device; and

DETAILED DESCRIPTION

Overview of Device

Figure 1:
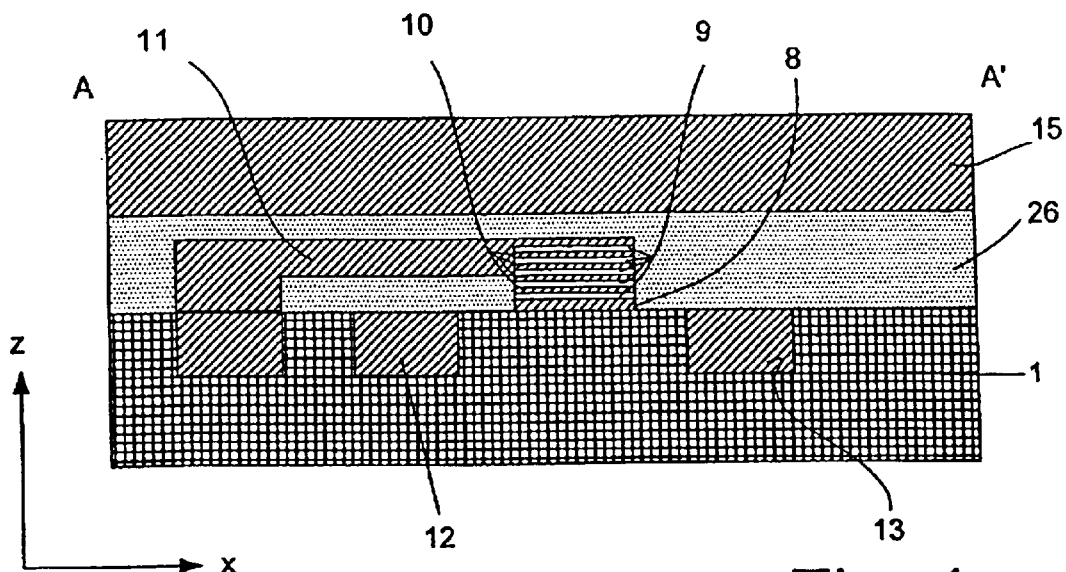
FIG. 1 is a schematic sectional view of a memory cell in accordance with the invention taken along the line A–A' of FIG. 2.
Figure 2:
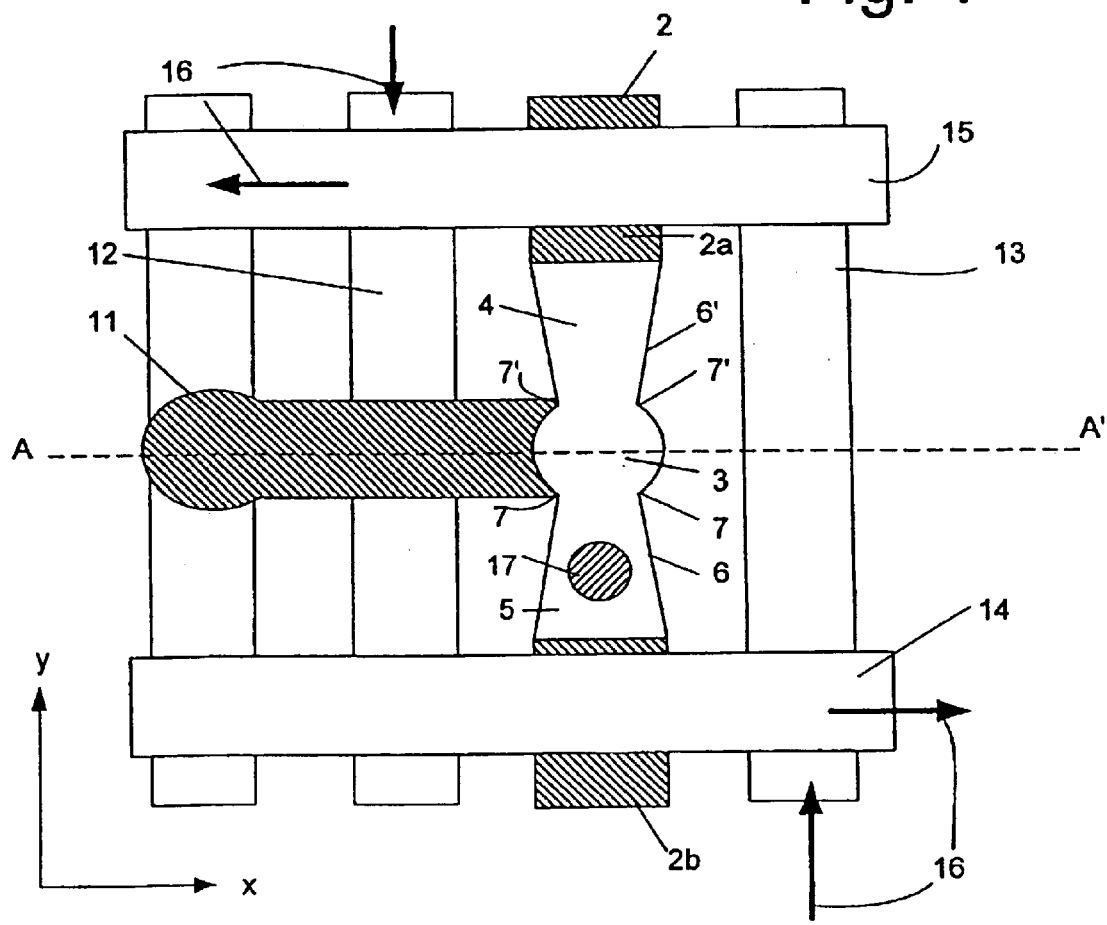
FIG. 2 is a plan view of a memory cell in accordance with the invention.

Referring to FIGS. 1 and 2, a memory cell C according to the invention is fabricated on a (0001) oriented sapphire substrate 1 which is overlaid by an elongate magnetic, electrically conductive element or stripe 2 which, as shown in FIG. 2 includes a central, ovoid or generally circular portion 3 which acts as a memory node and portions 4, 5 which have tapered edges 6, 6' so that edge discontinuities 7, 7' are provided between each of the tapered portions 4, 5 and the central, circular portion 3.

The magnetic, conductive strip 2 comprises a thin (~5 nm) intermediate buffer layer 8 of (0001) orientated platinum (Pt) with a width w less than 1 $\mu$m, which is overlaid by alternating layers 9, 10 of cobalt (Co) and Pt. The thickness of the layers 9, 10 is less 2 nm and may be deposited by sputtering. Thus, a layer system of non-magnetic, electrically conductive Pt layers and magnetic, conducting Co layers is produced, containing edge discontinuities 7, 7'.

A Hall contact 11 extends transversely in the −x direction from the node 3. The contact 11 is fabricated of a conductive material such as Pt and used to detect an extraordinary Hall effect (EHE) voltage as will be explained in more detail hereinafter. A layer of insulating material, for example $SiO_2$, overlies the current stripe 2 and the Hall contact 11.

The node 3 is surrounded by a magnetic field producing device in the form of transverse electrically conductive stripes 12–15 disposed in a cruciform arrangement which generates a magnetic field component $H_{perp}$ perpendicular to the x-y plane when a current is passed through the stripes in the direction of arrows 16. It will be seen that the combined effect of the currents flowing in the stripes 12–15, gives rise to a magnetic field shown schematically in FIG. 3. Thus, around the node 3, the conductors act the manner of Helholtz coil to produce a perpendicular field component that is directed normally to the plane of substrate 1. In the coordinate scheme shown in FIGS. 1 and 2, the stripes 12–15 lie in the x-y plane, and the perpendicular magnetic component field vector extends in the z direction.

As can be seen from FIG. 3, the field strength within the area enclosed by the cruciform intersection of the stripes 12–15 is greater than outside the enclosed area and so the stripe arrangement allows a magnetic field to be applied to the node 3 selectively. The stripes 12, 13 are formed beneath the node 3 and the Hall contact 11 within the substrate 1 and may typically be formed of aluminum. The stripes 14, 15 overlie the insulating layer 26 above the node 3 and may be made of aluminum.

A region 17 in tapered portion 5 of stripe 2 has much lower coercivity than the remainder of the stripe. This low coercivity region is produced by ion irradiation as will be explained hereinafter.

Writing Data

In order to store data, a current is applied to the magnetic field producing stripes 12–15 in the direction of arrows 16 so as to change magnetization of the conductive stripe 2. When a current is passed through the stripe 2, an EHE voltage is produced in Hall contact 11, dependent upon the magnetic state of the stripe 2. The level of EHE voltage is dependent upon the configuration of a magnetic domain induced in the stripe 3 as a result of the applied magnetic field. This will now be explained in more detail with reference to FIGS. 4 to 7. The memory cell is initialized by applying a strong negative magnetic field pulse in order to saturate the magetization in the stripe 2 in the −z direction i.e. perpendicular to the x-y plane containing the magnetic stripe 2, as shown by pulse 18 in FIG. 7a. Thereafter, a weak positive magnetic field i.e. in the +z direction is applied reference 19 in FIG. 7a. This weak, positive magnetic field promotes nucleation of a magnetic domain in the region 17 shown in FIG. 4. The magnetization of the domain is reversed compared to the remainder of the initialized stripe 2. The domain preferentially nucleates within the region of reduced coercivity 17. The resulting domain 0 is delimited by a domain wall DW that is just a few nm thick and behaves rather like a soap bubble. It always attempts to minimize its surface (domain wall length) by extending outwardly from its nucleation center in region 17, until it becomes pinned, as shown in FIG. 5, the pinning being produced by the edge discontinuities 7. This corresponds to a "0" stored memory state.

In order to write a "1" state onto the memory node, a stronger, positive (+z) field pulse is applied, referenced 20 in FIG. 7a. The stronger magnetic field overcomes the effect of the pinning for the "0" state and as a result, the domain wall DW expands past the pinning produced by the discontinuities 7, fills the circular node region 3 and is pinned by the discontinuities 7'.

The "0" state can be re-written by applying a negative field pulse of preferably equal strength to that used to write "1" state, namely pulse 21 shown in FIG. 7a. The negative going (−z) magnetic field results in a contraction of the domain D and its domain wall DW so that the domain D again becomes pinned by the discontinuities 7 as shown in FIG. 5. It will be seen from a comparison of FIGS. 5 and 6 that the magnetisation of the Pt/Co layers in the memory node 3 is reversed between a "0" state shown in FIG. 5 and a "1" state shown in FIG. 6 as a result of the magnetic domain either being pinned by the edge discontinuities 7 or 7'. The resulting magnetisation of the node 3 is thus switched between opposite senses for the "0" and the "1" states with the resulting magnetic field vector extending perpendicularly to the plane of the stripe 2.

The state of the node 3 can be read by measuring a Hall voltage on contact 11. A current $J_c$ is applied to the stripe 2. The current may comprise current pulses with a current density of ~$10^7$ A/cm$^2$, d.c. ~0.5 v, f~500 MHz or simply a single current pulse with a current density of ~$10^7$ A/cm$^2$, τ~1 ms. The magnetisation state of the node 3 results in a Hall voltage being developed on contact 11 in response to the current pulse, the Hall voltage being dependent upon the magnetisation state of node 3. Thus, for the "0" state shown in FIG. 5, a relatively low Hall voltage is produced whereas for the "1" state shown in FIG. 6, a relatively high Hall voltage is produced. With the relatively small dimensions and field strengths described herein, the extraordinary Hall effect dominates and conventional Hall resistivity is not a predominant factor. The detectable Hall signal of the cell is approximately 75% of VH=2IpH/t, where I is the applied current, t is the film thickness and pH. is the (extraordinary) Hall resistivity, a temperature-dependent material constant. The factor 2 is due to the change of magnetisation orientation from anti-parallel to parallel direction with respect to the applied field. The current-density j=I(t,d$_c$) should be arranged so that the sample will not be thermally destroyed during operation, and typically should not go beyond ~5×$10^7$ A/cm$^2$ for pulsed currents.

Typical values of pH in Pt/Co/Pt layer configurations and Co/Pt superlattices is approximately 0.6 $\mu\Omega$cm as described in J. Caulet, C. Train, V. Mathet, R. Laval, B. Bartenlian, P. Veillet, K. Le Dang, C. Chappert and C. L. Canedy, X. W. Li and Gang Xiao, Phys. Rev. B62 508 (2000). This corresponds to a maximal signal change between the "1" and "0" states of 3 mv at the Hall contact 11.

FIG. 7b illustrates the EHE voltage developed at contact 11 in response to the sequence of magnetic field pulses 18–21 shown in FIG. 7a As regards the temperature range of operation, both the domain wall velocity and the extraordinary Hall resistivity increase with increasing operating temperature of the device. These tendencies improve the operational characteristics of the device, by improving the switching speed between the "0" and "1" states and increasing the signal level. However, the pinning strength of the domain wall, which corresponds to the stability of the written data, decreases with increasing temperature. The working temperature of the device is close to room temperature and can be optimised by an appropriate selection of the magnetic layer system used for the memory node.

Device Fabrication

Fabrication of the device will now be described with reference to FIG. 8. Referring to FIG. 8a, the sapphire substrate 1 is subject to e-beam lithography and etching in order to provide trenches 22, 23 and 24. The trenches 22 and 23 correspond to the location of the lowermost conductive stripes 12, 13 shown in FIG. 1. Trench 24 corresponds to the location of a conductor 25 to be connected to the Hall contact 11. Thereafter, suitable electrical conductive material is sputtered into the trenches 22, 23 and 24, for example aluminum. The upper surface 40 of the substrate 1 is then polished by a suitable conventional technique to provide the configuration shown in FIG. 8a.

Figure 8B:
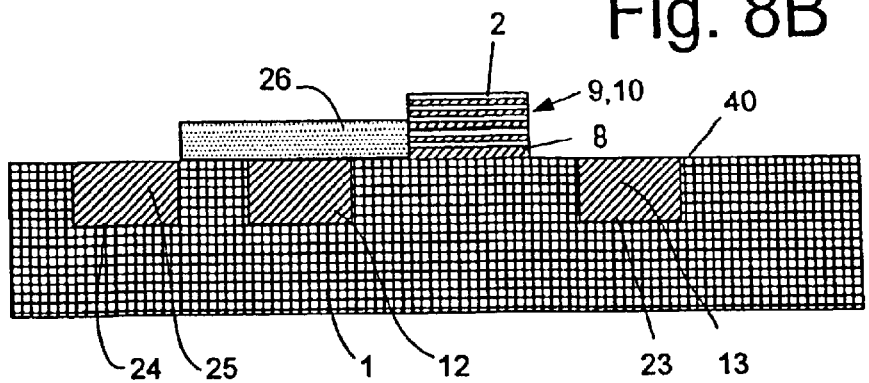

Then as illustrated in FIG. 8b, the Pt buffer layer 8 and the Co—Pt layers 9, 10 are deposited by sputtering. Pt (111) can grow epitaxially on a sapphire $Al_2O_3(0001)$ surface. Reference is directed to R. Farrow, G. R. Harp, R. F. Marks, T. A. Rabedeau, M. F. Toney, D. Weller, S. S. P. Parkin, J. Cryst. Growth 122, 47 (1993). In order to prepare the surface 40 for the sputtering process, chemical surface reconstruction is carried out prior to deposition of the layers 8, 9, 10, by dipping the substrate in a solution of $NH_4OH$ (28%): $H_2O_2$ (30%): $H_2O$ (1:1:100), for two minutes. After rinsing the ethanol and water, the substrate is dried in nitrogen gas and the introduced into a sputtering chamber (not shown) where it is annealed for 20 minutes at a temperature of 650° C.

Two different sputtering techniques are employed to create the Pt—Co films on the substrate. In order to deposit the first, Pt buffer layer 8, direct current (DC) sputtering is employed whereas radio frequency (RF) sputtering is utilised to deposit the subsequent Co and Pt layers 9,10.

For the deposition of the Pt layers 10, a magnetron cathode is used as the sputtering target and the resulting plasma is confined by magnetic fields near the target, enhancing the deposition efficiency and optimising the film growth. For the deposition of the Co films 9, since it is a ferromagnetic material, the target concentrates the magnetic flux and no magnetron effect is utilised. Co is thus sputtered using the standard RF diode technique.

The thin film deposition of the layers is carried out in four successive steps. Initially, at an argon pressure of $5 \times 10^{-3}$ mb and a substrate temperature of 610° C., the buffer layer 8 is grown epitaxially on the sapphire surface using DC magnetron sputtering at a growth rate of 2.5 Å/s, to a thickness of 40 Å. By such a technique, the mismatch between the Pt (111) and $Al_2O_3$ (0001) is less than 1%. The resulting buffer layer 8 thus comprises a (111) textured polycrystalline layer, which is flat and continuous, with a surface roughness of 2–3 Å when measured with an atomic force microscope.

Next, a 5 Å Pt layer is sputtered in the RF mode at a rate of 0.2 Å/s at a substrate temperature of 300° C. in order to optimise the interface quality with the Co layer to be grown thereafter. Immediately thereafter, Co and Pt layers 9, 10 are successively deposited by RF sputtering, maintaining the same sputtering conditions, namely a substrate temperature of 300° C. and a growth rate of 0.2 Å/s. The process is repeated so as to build up successive pairs of layers 9, 10. A final Pt cap layer of a thickness of the order of 3 nm, overlays the Co—Pt layer system. The resulting structure may comprise a $[Pt(14 Å)—Co(3 Å)]_{m<10}$—$Pt(14 Å)$ multi-layer.

By the use of RF sputtering with a low sputter growing rate of the order of 0.2 Å/s, high quality films are produced without significant intermixing of Co and Pt, as described in J. Wunderlich, Ph.D. Thesis, Institut d'Electronique Fondamentale (Université Paris-Sud, Orsay-France) and Max Planck Institut für Mikrostrukturphysik (Halle-Germany), ISBN 3-8265-9110-0, (2001). Then, high-resolution electron-beam lithography is employed to shape the sputtered layers into the elongate stripe 2. The sputtering is carried out such that in regions 2a, 2b (FIG. 2) of the stripe each comprise solely a layer of Pt and the Co—Pt layer system is configured solely in the regions 3, 4, 5.

A shown in FIG. 8b, a region 26 of insulating material such as $SiO_2$ is deposited by conventional sputtering and electron beam lithographic techniques, between the stripe 2 and the conductor 25.

Figure 8C:
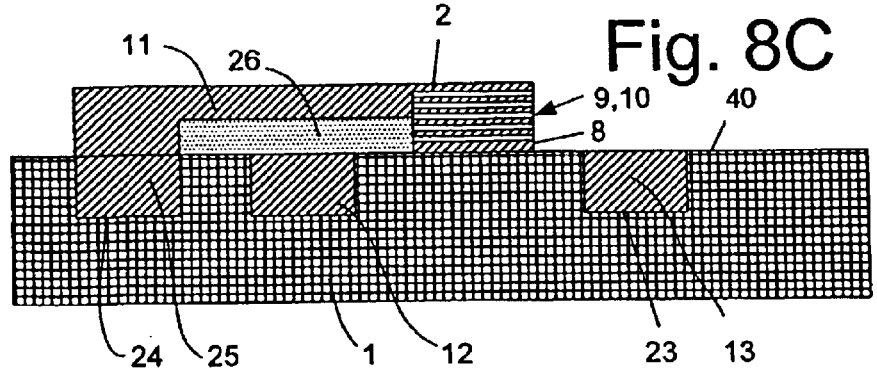
Figure 8D:
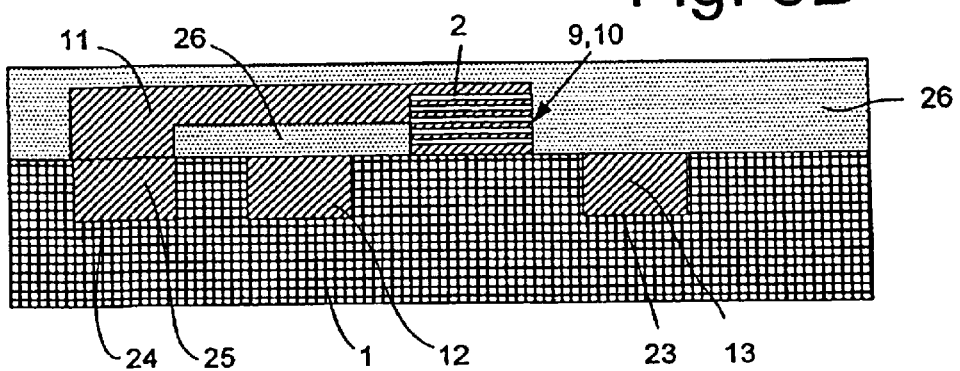
Figure 8E:
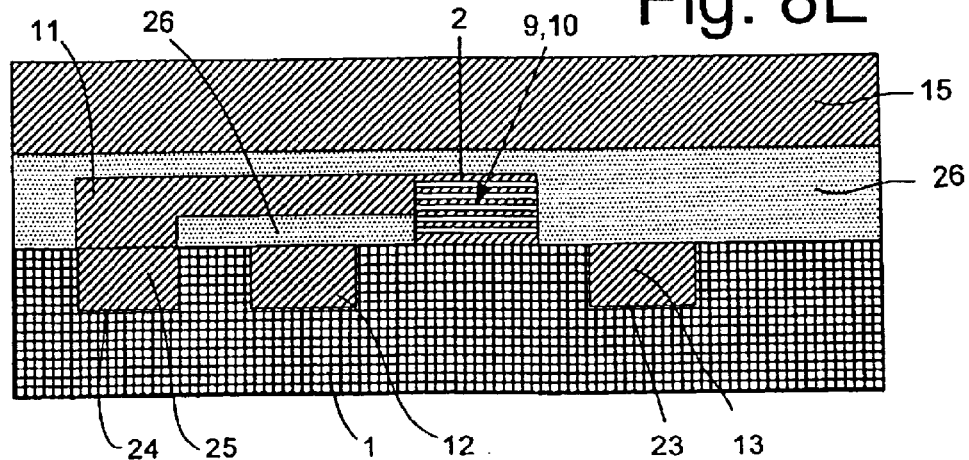

Then as shown in FIG. 8c, the Hall contact 11 is formed by sputtering Pt according to the techniques just described, so as to form an electrical connection with the stripe 2 and also the buried conductor 25. Thereafter, further insulating material 12, typically $S_iO_2$ is sputtered over the resulting structure, as shown in FIG. 8d. Then, the upper conductive stripes 14, 15 are deposited using conventional lithographic and sputtering techniques so as to achieve the structure shown in FIG. 8e, which corresponds to FIG. 1.

Focussed ion beam lithography using $He^+$ or $Ga^+$ ions is used to create the reduced coercivity region 17, so as to provide an artificial nucleation centre for the magnetic domain D within the device. The irradiation modifies the magnetic properties of the region 17 by inducing mixing at the Co/Pt interfaces, as described in C. Chappert et al, Science 280, 1919 (1998) and T. Aign, P. Meyer, S. Lemerie, J. -P. Jamet, J. Ferré, V. Mathet, C. Chappert, J. Gierak, C. Vieu, F. Rousseaux, H. Launois and H. Bernas, Phys. Rev. Lett. 81, 5656 (1998). The coercive field as well as the Curie temperature are thus decreased in comparison with the non-irradiated regions as described in C. Vieu, J. Guerack, H. Launois, T. Aign, P. Meyer, J. -P. Jamet, J. Ferré, C. Chappert, V. Mathet, H. Bernas, Microelectronic Engineering 53, 191 (2000). Whilst the region 17 is shown in the tapered portion 5 of stripe 2, it will be understood that it could be located elsewhere, for example in the tapered portion 4.

From the foregoing, it will be understood that the memory cell in accordance with the invention stores information in terms of the configuration of a single magnetic domain wall DW in a nano-structured media, in particular a Pt/Co/Pt layer system in which a magnetisation reversal process can be carried out. Detailed studies of this reversal process in thin Pt/Co films and similar thin layer systems that have an easy magnetisation axis perpendicular to the film plane are described in S. Lemerle, PhD. Thesis, Université Paris XI, Orsay (1998) and J. -P. Jamet, S. Lemerle, P. Meyer and J. Ferré, Phys. Rev. B57, 14319 (1998). The magnetisation reversal starts by nucleation of a domain of opposite magnetisation, delimited by the domain wall, and continues by the growth of the magnetic domain due to domain wall propagation, as described with reference to FIGS. 5 and 6.

As previously explained, it has been found that the magnetic domain D behaves like a two dimensional soap bubble and always attempts to minimise its surface area and thus can be subjected to pinning. The pinning can be due to the soap bubble like behaviour of the domain where it contacts the discontinuities 7, 7' shown in FIG. 2 and also may be due to inhomogenities of the demagnetisation energy density which occur in the region of the sharp edges 7, 7'. This is discussed in more detail in J. Wunderlich, Ph.D. Thesis, Institut d'Electronique Fondamentale (Université Paris-Sud, Orsay-France) and Max Planck Institut für Mikrostrukturphysik (Halle-Germany), ISBN 3-8265-9110-0, (2001).

As previously explained, the different configurations of the domain D for the "0" and "1" states shown in FIGS. 5 and 6, produce different levels of Hall voltage on contact 11. In the described device, the extraordinary Hall effect dominates. Two mechanisms that give rise to EHE have been identified, namely skew scattering and side jump scattering. Skew scattering is described in J. Smit, Physica 24, 39 (1958). Side jump scattering is described in L. Berger, Phys. Rev. B2, 4559 (1970). These two mechanisms result from spin dependent asymmetrical scattering of spin-polarised electrons in the presence of spin orbit coupling. Since the magnetism of transition metals such as Co is due to the spin polarisation of its d-electrons, the averaged orientation of the spin polarisation direction of these itinerant conduction electrons determines the macroscopic magnetisation. Since the in-plane current in a two-dimensional magnetic layer system is spin polarised with respect to the perpendicular-to-plane component, the EHE depends on the actual magnetisation distribution of the perpendicular-to-plane magnetised layer system.

It has been found that materials with a high spin-orbit interaction such as Pt and Au demonstrate a high extraordinary Hall signal and experiments have shown that an increase of Hall resistivity occurs with temperature due to increasing phonon scattering. Thus by an appropriate selection of materials and conditions, the EHE resistivity can be optimised in the device according to the invention.

Memory Cell Array

Figure 9:
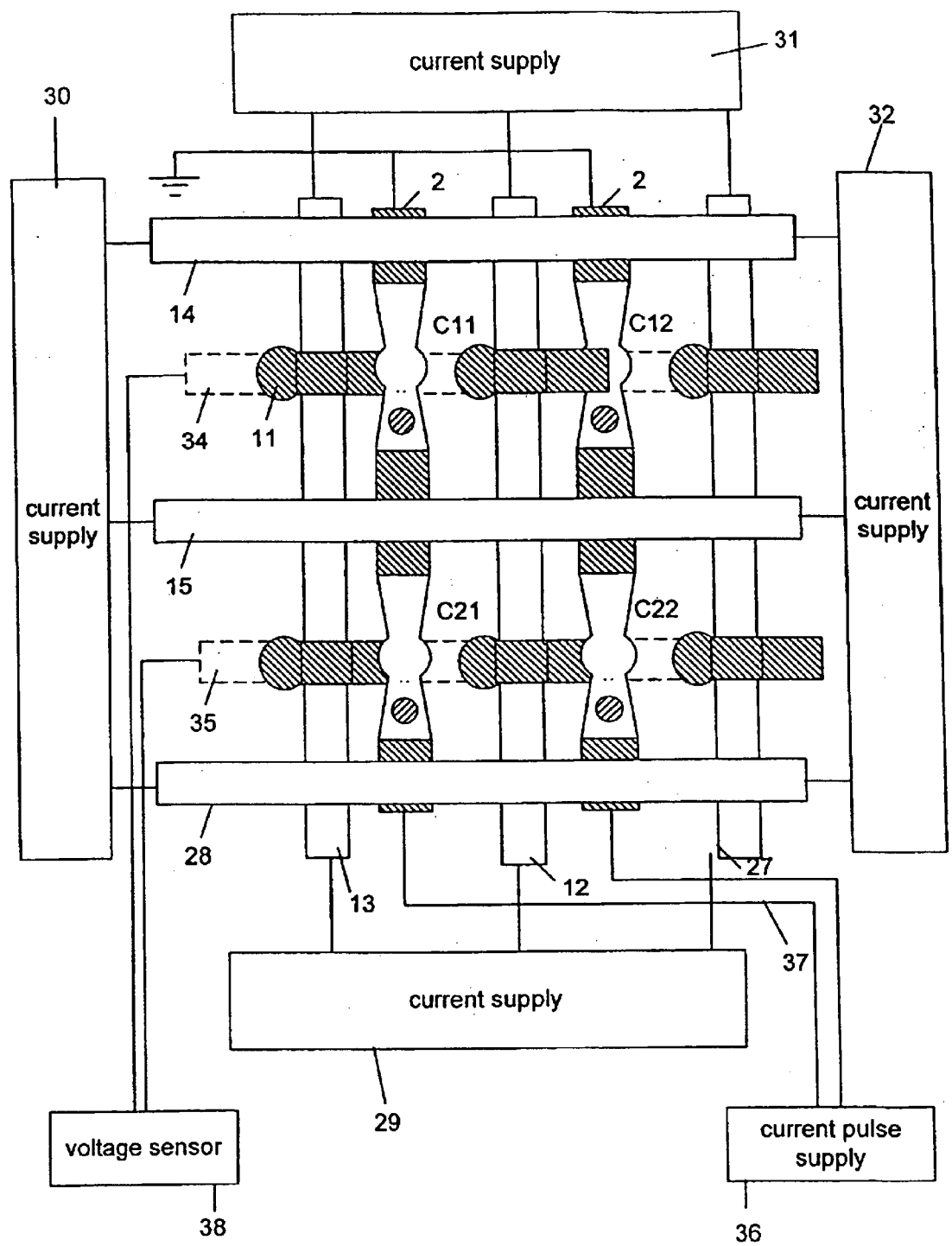
FIG. 9 illustrates a memory cell array in accordance with the invention.

Referring now to FIG. 9, an example of a memory cell array according to the invention is shown that comprises a 2×2 array of memory cells C, although it will be appreciated that the principles of the device can be extended to much larger cell arrays. Cell $C_{11}$ corresponds to cell C of FIG. 2 and all the cells in the array have an identical structure. Each memory cell C is provided with its own magnetic field producing device defined by upper and lower conductive stripes 14, 15, 28 and 12, 13, 27, which are energised by current supply devices 29, 30, 31 and 32. Thus, by appropriately energising the stripes, a magnetic field can be applied to the memory cells individually to enable them to be selectively switched between the "0" and "1" memory states.

The magnetic, conductive stripes 2 for the cells concerned are connected together in columns and the Hall contacts 11 of the cells are connected together in rows by means of conductive stripes 34, 35 that are buried in the substrate.

In order to read the memory state of a particular cell, a current pulse supply circuit 36 applies a current pulse to the stripe 2 of the cell concerned For example when the memory cell $C_{11}$ is to be read, a current pulse is applied to line 37 so as to pass a current through stripe 2 of cell $C_{11}$. A corresponding EHE voltage is produced on contact 11 and is supplied through stripe 34 to a voltage sensor 38 connected to buried stripes 34, 35. Thus, the voltage received at sensor 38 corresponds to the memory state i.e. "1" or "0".

Many modifications and variations of the invention are possible. For example, whilst the described example makes use of a Co/Pt layer system in the form of a superlattice at the memory node 3, it would be possible to use a single ultra thin Co layer sandwiched between two platinum layers. In addition, the magnetic layer system may be modified by $He^+$ ion irradiation, which induces intermixing at the interfaces between the Pt and Co. this decreases the coercivity of the magnetic layer system and promotes easy domain wall propagation at very low applied magnetic fields, of less than 100 Oe, as described in T. Devolder, J. Ferre, C. Chappert, H. Bernas, J-P Jamet and V. Mathet, Phys. Rev. B 64, 064415 (2001). The ion irradiation may increase the EHE demonstrated by the device. Furthermore, other material systems can be used. For example, instead of using a sapphire substrate, the Pt—Co layer system can be grown on a $S_iO_2$ surface. Also, $\tau$-$Mn_{0.6-x}Ni_xAl_{0.4}$ where x<0.08 thin films epitaxially grown on GaAs can be utilised. Such films exhibit a large Hall resistivity of up to 7 $\mu\Omega$cm and demonstrate very square hysteresis loops at low applied fields. This facilitates propagation of the domain wall at low field strengths typically between 100–200 Oe. More particularly, thin (~10 nm) epitaxial films of $\tau$-$Mn_{0.6-x}Ni_xAl_{0.4}$ where x<0.08 alloys on a (001) oriented GaAs substrate may be used since they demonstrate strong EHE and easy domain wall propagation at relatively low magnetic fields (~2 KOe) as described by T. Sands et al, J. Appl. Phys. 73 (10), 6399 (1993).

What is claimed is:

1. A magnetic memory cell comprising:
   an elongated, magnetic, electrically conductive element,
   a magnetic field producing device to apply a magnetic field to the element and
   a contact to allow detection of a Hall voltage developed across the element;
   the element being configured to allow a magnetic domain to be induced therein and having a first pinning portion and a second pinning portion for pinning its domain wall whereby the domain wall can be pinned to at least one of the first pinning portion and the second pinning portion dependent upon the magnetic field produced by the magnetic field producing device, and such that the first and second different values of the Hall voltage are produced dependent upon pinned positions of the domain wall when an electrical current is passed through the element.

2. The magnetic memory cell according to claim 1 wherein the element comprises at least one generally planar layer of magnetic material with its easy axis of magnetization extending transversely to the plane thereof.

3. The magnetic memory cell according to claim 2 wherein each of the layers of magnetic material are disposed between layers of non-magnetic electrically conductive material.

4. The magnetic memory cell according to claim 2 or wherein the element comprises a sandwich of layers of Cobalt between layers of Platinum.

5. The magnetic memory cell according to claim 2 wherein the element comprises layers of $t$-$Mn_{0.6-x}Ni_xAl_{0.4}$ where x<0.08.

6. The magnetic memory cell according to claim 1 wherein the element has a region of reduced coercivity to receive the induced magnetic domain.

7. The magnetic memory cell according to claim 6 wherein the region of reduced coercivity has been produced by ion irradiation.

8. The magnetic memory cell according to claim 1 wherein the element includes an edge discontinuity to form one of said first and second pinning portions.

9. The magnetic memory cell according to claim 8 wherein the element comprises a portion with tapered edges and a contiguous portion with a generally circular periphery, such that the edge discontinuity occurs between the portions.

10. The magnetic memory cell according to claim 9 wherein the tapered portion has been subject to localized ion irradiation to promote formation of the magnetic domain therein.

11. The magnetic memory cell according to claim 1 wherein the element has been ion irradiated.

12. The magnetic memory cell according to claim 1, wherein the element is configured on a substrate, and the magnetic field producing device comprises conductive strips overlying the substrate around the element.

13. The magnetic memory cell according to claim 1 including a pulse generator to apply a current pulse to the element to produce the Hall voltage.

14. A memory device including an array of memory cells each as claimed in claim 1.

15. A method of fabricating a memory device, comprising
   forming an elongated, magnetic, electrically conductive element on a substrate,
   providing a magnetic field producing device on the substrate for applying a magnetic field to the element, and
   fabricating a contact to allow detection of a Hall voltage developed across the element, and configuring the element to allow a magnetic domain to be induced therein and having a first pinning portion and a second pinning portion for pinning its domain wall so that the domain wall can be pinned to at least one of the first pinning portion and the second pinning portion dependent upon the magnetic field produced by the magnetic field producing device, and such that first and second different values of the Hall voltage are produced dependent upon pinned positions of the domain wall when an electrical current is passed through the element.

16. A memory device comprising a generally planar magnetic and electrically conductive memory node with its easy axis of magnetization extending generally perpendicular to said plane, and an electrode to detect an extraordinary Hall effect voltage as a function of the magnetization state of the memory node.

17. The magnetic memory cell according to claim 1, wherein the Hall voltage detected by the contact is a voltage caused by Extraordinary Hall Effect.

18. The magnetic memory cell according to claim 17, wherein said contact detects the Extraordinary Hall voltage at a portion between said first and second pinning portions of the element.

19. A magnetic memory device having memory cells, each of the memory cells comprising:

a magnetic field producing device;

a magnetic element being configured to allow a magnetic domain to be induced therein and having first and second pinning portions to which domain wall of the magnetic domain can be pinned and a node positioned between said first and second pinning portions, wherein the domain wall can be pinned to at least one of said first and second pinning portions dependent upon the magnetic field produced by the magnetic field producing device, and wherein a magnetization status of said node is changed dependent upon where the domain wall is pinned to; and a detector element detecting the magnetization status of said node.

20. The magnetic memory device according to claim 19, further comprising a pulse generator to apply a current pulse to the magnetic element.

21. The magnetic memory device according to claim 20, wherein said detector element detects the magnetization status of said node by detecting the Hall voltage caused by the current pulse.

22. The magnetic memory device according to claim 21, wherein the Hall voltage is caused by Extraordinary Hall Effect.

23. The magnetic memory device according to claim 22 wherein the magnetic element comprises at least one generally planar layer of magnetic material with its easy axis of magnetization extending transversely to the plane thereof.

24. The magnetic memory device according to claim 23 wherein each of the layers of magnetic material are disposed between layers of non-magnetic electrically conductive material.

25. The magnetic memory device according to claim 22 wherein the magnetic element has a region of reduced coercivity to receive the induced magnetic domain.

26. The magnetic memory device according to claim 22 wherein the magnetic element includes an edge discontinuity to consist of one of said first and second pinning portions.

27. The magnetic memory device according to claim 25 wherein the node having a generally circular periphery and the magnetic element having a portion with tapered edges, such that the edge discontinuity occurs between the node and the portion.

28. The magnetic memory device according to claim 22 wherein the magnetic element is configured on a substrate, and the magnetic field producing device comprises conductive strips overlying the substrate around the magnetic element.

* * * * *